United States Patent [19]

Ono et al.

[11] 3,753,808

[45] Aug. 21, 1973

[54] METHOD OF MAKING A HIGH FREQUENCY LIGHT EMITTING $GaAs_{1-x}P_x$ (0<X<0.6) DIODE

[75] Inventors: Yuichi Ono, Kokubuji; Masahiko Ogirima, Tokyo; Toshimitu Shinoda, Hamura; Kazuhiro Kurata, Hachioji, all of Japan

[73] Assignee: Hitachi, Ltd., Japan

[22] Filed: Feb. 12, 1971

[21] Appl. No.: 114,758

[30] Foreign Application Priority Data

Feb. 12, 1970 Japan ................................ 45/11452

[52] U.S. Cl. .................. 148/189, 148/186, 148/190, 252/62.3 GA

[51] Int. Cl. ............................................... H01l 7/44

[58] Field of Search .................... 148/190, 189, 186; 252/62.3 GA

[56] References Cited

UNITED STATES PATENTS

| | | | |
|---|---|---|---|
| 2,858,275 | 10/1958 | Folberth | 252/62.3 GA |
| 3,333,135 | 7/1967 | Galginaitis | 148/171 UX |
| 3,578,507 | 5/1971 | Chiang et al. | 148/186 X |
| 3,485,685 | 12/1969 | Casey et al. | 148/190 X |

OTHER PUBLICATIONS

Nygren et al., "Zinc Diffusion into Gallium Phosphide under High and Low Phosphorus Overpressure," J. Electrochem. Soc., Vol. 116, May 1969, pp. 648–654. TP 250.A54J

*Primary Examiner*—G. T. Ozaki
*Attorney*—Craig, Antonelli, Stewart & Hill

[57] ABSTRACT

A method of making a high efficiency light emitting $GaAs_{1-x}P_x$ ($0<x<0.6$) diode, wherein Zn is diffused as acceptor into an n-type crystal by using a diffusion source, whose composition lies, in a Ga-P-Zn phase diagram, in a triangular region, the three apices of which are $Zn_3P_2$, GaP and the point where the content in P is lowest in the region having a higher content in P among two liquid phase regions; a window through which light generated at a p-n junction formed therein can emerge from the crystal with high external quantum efficiency is thereby formed by an enrichment in P at the same time as the surface layer of an n-type $GaAs_{1-x}P_x$ ($0<x<0.6$) crystal is converted into a p-type layer.

7 Claims, 5 Drawing Figures

INVENTORS
YUICHI ONO, MASAHIKO OGIRIMA,
TOSHIMITU SHINODA
BY AND KAZUHIRO KURATA

Craig, Antonelli, Stewart & Hill
ATTORNEYS

INVENTORS
YUICHI ONO, MASAHIKO OGIRIMA,
TOSHIMITU SHINODA
BY AND KAZUHIRO KURATA

Craig, Antonelli, Stewart & Hill
ATTORNEYS

METHOD OF MAKING A HIGH FREQUENCY LIGHT EMITTING GAAS $_{1-x}P_x$ (0<X<0.6) DIODE

BACKGROUND OF THE INVENTION

1. Field of the Invention

The present invention relates to a method of making a light emitting $GaAs_{1-x}P_x$ ($0<x<0.6$) diode having a window through which light generated at a p-n junction formed therein can emerge from the diode with high external quantum efficiency.

2. Description of Prior Art

Light emitting $GaAs_{1-x}P_x$ ($0<x<0.6$) diodes are most widely utilized among light emitting semiconductor devices. The p-n junction for $GaAs_{1-x}P_x$($0<x<0.6$) crystals is formed generally by diffusing Zn as acceptor into an n-type crystal doped with impurities such as Te, Se, and the like. In this case the diffusion speed should be maintained at relatively low levels by controlling the partial pressure of As by means of a diffusion source of $ZnAs_2$ or a Ga-As-Zn system for the diffusion process, in order to obtain a flat diffusion front.

Light emitted by a semiconductor bulk crystal is generated at a p-n junction formed in it, and therefore light emerging from the bulk crystal, has to pass through either a p-type layer or an n-type layer. Thus, the amelioration of the external quantum efficiency of light emitting semiconductor diodes requires to decrease the light absorption by a semiconductor layer, through which light emerges from the bulk crystal. This is achieved for $GaAs_{1-x}P_x$ mixed crystals by increasing the content in GaP, which has a wider forbidden band than the other constituent compound, so that a window effect, i.e., a shift of the absorption edge toward the short wave length, is obtained. The amelioration of the external quantum efficiency of light emitting semiconductor diodes by the window effect is possible for a p-n junction formed by the epitaxial growth method, but it is difficult for a p-n junction formed by the diffusion method. No impurity source for the diffusion process providing an acceptor and at the same time a window to an n-type $GaAs_{1-x}P_x$ ($0<x<0.6$) bulk crystal was knonw heretofore.

SUMMARY OF THE INVENTION

The object of the present invention is to provide a method of making high efficiency light emitting $GaAs_{1-x}P_x$ ($0<x<0.6$) diodes.

In accordance with the invention, a ternary system of Ga-P-Zn, more particularly a ternary system in the triangular region of the Ga-P-Zn phase diagram, the three apices of which are $Zn_3P_2$, GaP and the point where the content in P is lowest in the region having a higher content in P among two liquid phase regions, is used as diffusion source for the diffusion of Zn into an n-type $GaAs_{1-x}P_x$ ($0<x<0.6$) crystal.

The diffusion source belonging to the above-mentioned triangular region was investigated already by S. F. Nygren and G. L. Pearson for GaP crystals in their article entitled "Zinc Diffusion into Gallium Phosphide under High and Low Phosphorous Overpressure" published in the Journal of the Electrochemical Society, Volume 116, No. 5, 1969, p. 648~654. However, according to the applicants' experiments, it was found that, in addition to the effects of the diffusion source described in this article, the diffusion source of the present invention produces a flatter diffusion front than the diffusion source consisting of Zn only, and the former produces also the window effect due to the fact that As atoms near a crystal surface are replaced by P atoms, which make the forbidden band wider.

The foregoing object, features and advantages of the invention will be apparent from the following detailed description of preferred embodiments in conjunction with the accompanying drawing.

DESCRIPTION OF PREFERRED EMBODIMENTS

Two diffusion sources indicated in Tables 1 and 2 were prepared in a conventional manner:

TABLE 1

| Component of diffusion source | Weight (in mg) |
|---|---|
| Ga | 5.0 |
| P | 2.2 |
| GaP | 5.0 |
| Zn | 13.6 |

TABLE 2

| Component of diffusion source | Weight (in mg) |
|---|---|
| Ga | 3.6 |
| P | 1.6 |
| GaP | 6.0 |
| Zn | 5.4 |

Figure 1:
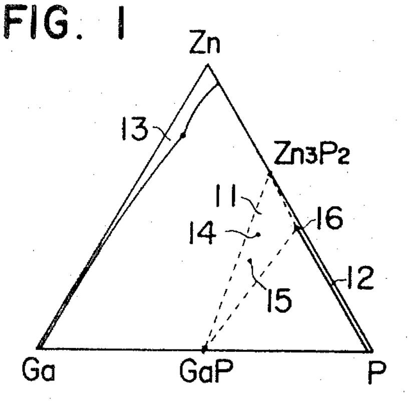
FIG. 1 represents the Ga-P-Zn phase diagram at 900°C.

These diffusion sources are indicated by numerals 14 and 15 in the triangular region 11 in the Ga-P-Zn phase diagram of FIG. 1, where numerals 12 and 13 are liquid phase regions while the other part represents a solid phase region. Three apices of the triangular region 11 are, as seen readily in this figure, $Zn_3P_2$, GaP and the point 16 where the content in P is lowest in the liquid phase region 12 having a higher content in P among the two liquid phase regions 12 and 13.

EXAMPLE 1

A diffusion source indicated in Table 1 and an n-type $GaAs_{1-x}P_x$ ($0<x<0.6$) crystal to be doped with Zn are placed in an ampoule of a high purity refractory material such as quartz. The ampoule is evacuated by means of an oil diffusion pump, until a high vacuum of about $10^{-6}$ Torr is obtained. After maintaining this high vacuum for about one hour, the ampoule is sealed off. The sealed ampoule is placed for one hour in an electric furnace maintained at 750°C so as to diffuse Zn into the crystal to a depth of about 3 $\mu$. It will be appreciated that the temperature of the furnace may be varied so that the ampoule is heated at a temperature between about 700°C and about 800°C. After taking out the ampoule, it is water-quenched and then the $GaAs_{1-x}P_x$ sample doped with Zn is removed from the ampoule. The surface, which has been the upper side during the diffusion, is attached to a glass plate by using "Electronwax" or "Silax." The backside surface is lapped with No. 4000 carborundum in order to remove a Zn diffusion layer on it. The lapped backside surface is coated with Ni by electroless plating, to constitute a negative electrode.

The sample is then detached from the glass plate, washed with alcohol or trichlorethylene and dried. A gold layer is deposited by evaporation on the surface, which has been the upper side during the diffusion process. The evaporation process is carried out with the crystal heated at 500°C under a vacuum of about $10^{-5}$ Torr. A KTFR (Kodak Thin Film Resin) photo-resist layer about 7,000 A thick is applied to the surface, which is exposed through a photo-mask for mesa-etching. After developing it, it is baked at 180°C for twenty minutes. The mesa-etching is carried out for three minutes by using a $H_2SO_4 : H_2O_2 : H_2O$ (2 : 1 : 1) solution at 60°C so as to etch-off a surface layer about 20 μ thick, which is much thicker than the Zn diffusion layer. During this process the rear side surface is coated with apiezon wax in order to prevent mesa-etching on it. After dissolving the apiezon wax by using trichloroethylene, the photo-resist layer is removed. The light emitting diode array thus obtained is scribed into a plurality of single diodes.

Figure 2:
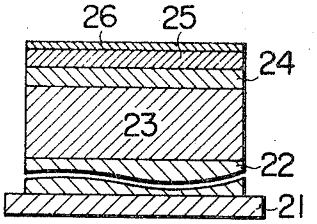
FIG. 2 is a sectional view of a diode made of $GaAs_{1-x}P_x$ ($0<x<0.6$) doped with Zn according to the present invention.

FIG. 2 is a sectional view of a diode made by this method, where reference numeral 21 designates the negative electrode, reference numeral 22 an $n^+$-type GaAs substrate about 100 μ thick doped with Se, Te, or S, reference numeral 23 an n-type $GaAs_{1-x}P_x$ ($x = 0.4$) layer about 50 μ thick doped with Se, Te, or S, reference numerals 24 and 25 designate p-type $GaAs_{1-x}P_x$ ($0.4<x<0.5$) layers doped with Zn according to this invention, in which x increases gradually from 0.4 to 0.5 with increasing distance from the n-type $GaAs_{1-x}P_x$ ($x = 0.4$) layer 23, and p-type layer 25 is doped more strongly with Zn for the purpose of decreasing the electric resistance near a positive electrode 26. The sum of the thickness of the layer 24 and that of the layer 25 is about 3 to about 5 μ.

Figure 3:
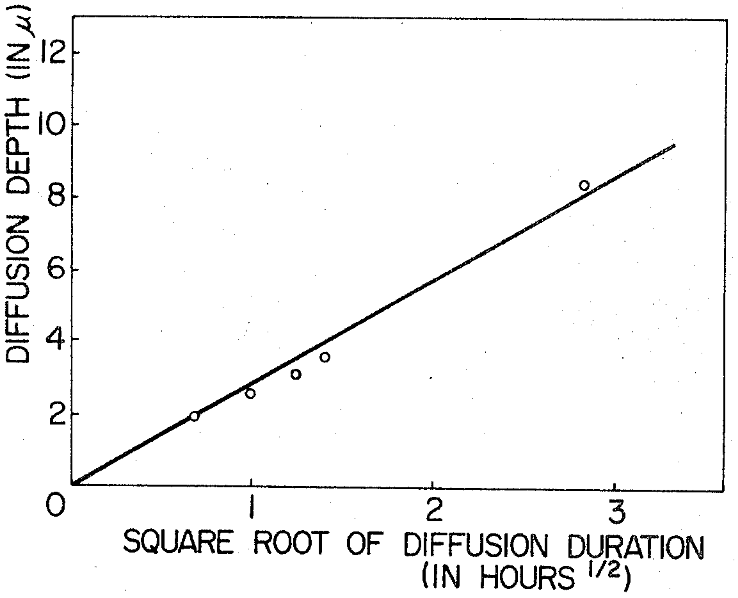
FIG. 3 indicates the relationship between the duration of the diffusion process and the depth of diffusion layer in accordance with the present invention.

The sample thus obtained was lapped at a 3° beveled surface and the p-n junction was revealed by an etching solution in order to examine the flatness of the diffusion front and the diffusion depth. It was found that the diffusion front was flat for all the samples and that there were no significant fluctuations in the diffusion depth. FIG. 3 indicates the relation between the duration of the diffusion process and the diffusion depth for a diffusion temperature of 750°C. The abscissa represents the square root of the duration in hours and the ordinate the diffusion depth in microns. From FIG. 3, the following relation can be obtained:

$$x = \sqrt{5 \times 10^{-11}\, t},$$

where $t$ is the duration of diffusion in seconds and $x$ is the diffusion depth in cm.

Figure 4:
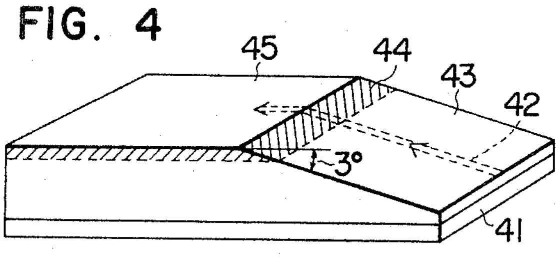
FIG. 4 is a perspective view of a sample of $GaAs_{1-x}P_x$ ($0<x<0.6$) crystal examined as to the content in P by means of an X-ray microanalyzer.
Figure 5:
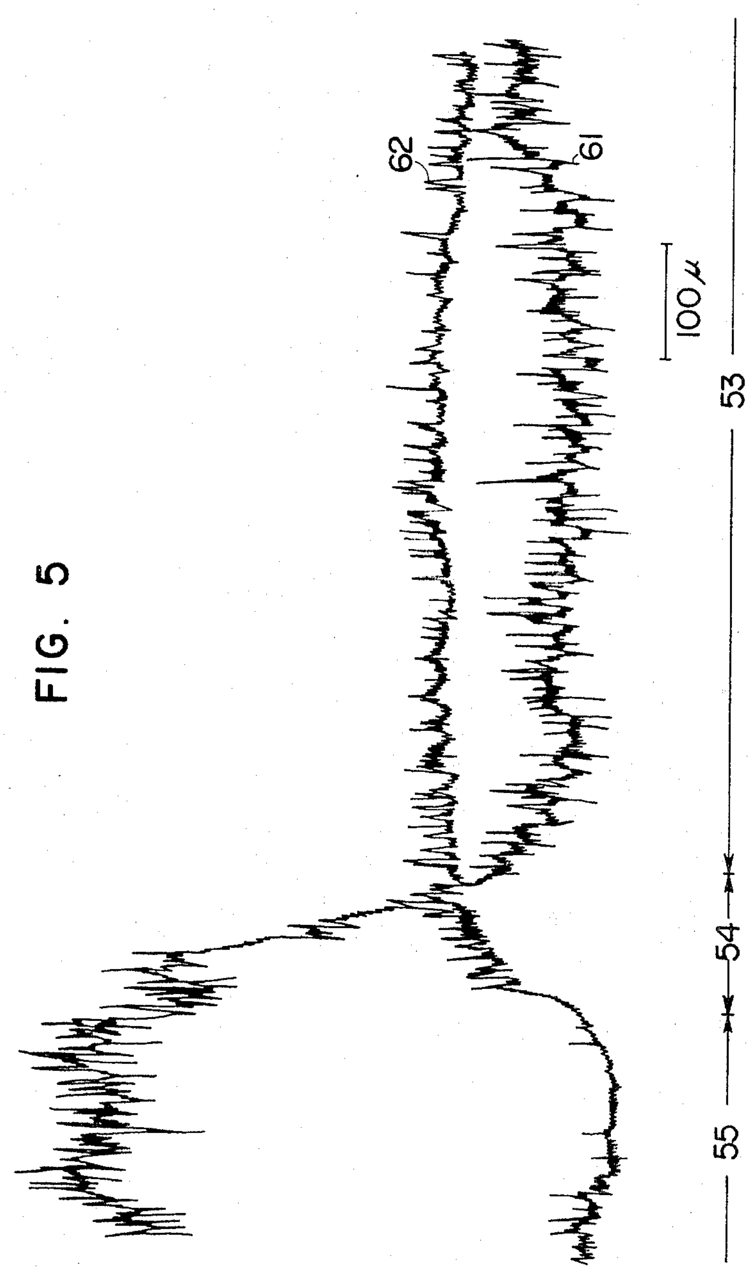
FIG. 5 represents curves, obtained by using an X-ray micro-analyzer, indicating the variation of the contents in P and in As, respectively, in a $GaAs_{1-x}P_x$ ($0<x<0.6$) crystal according to the present invention.

A sample, into which Zn was diffused for 1.5 hours in accordance with the invention, was lapped at a 3° beveled surface, as indicated in FIG. 4, where reference numeral 41 designates the GaAs substrate, reference numeral 42 an arrow mark indicating the direction of scanning with an electron beam for the purpose of investigating the content in P by means of an X-ray micro-analyzer, reference numeral 43 the 3° beveled surface of the $GaAs_{1-x}P_x$ ($x = 0.4$), reference numeral 44 that of the $GaAs_{1-x}P_x$ ($0.4<x<0.5$), and reference numeral 45 the original surface of the crystal. The results are shown in FIG. 5, where reference numeral 61 designates a curve indicating the content in P and reference numeral 62 a curve indicating the content in As. The ordinate gives the relative intensity for both curves, but the units are different for the two curves. Reference numerals 53, 54 and 55 indicate the regions corresponding to the $GaAs_{1-x}P_x$ ($x = 0.4$) layer, the $GaAs_{1-x}P_x$ ($0.4<x<0.5$) layer and the original surface, respectively. As shown in FIG. 5, the content in P begins to increase at about 720 μ from the edge of the crystal, and then increases gradually up to the surface. The content in As decreases, as that in P increases. Although it is difficult to determine exactly the position of the diffusion front of Zn and that of P due to the finite curvature of the boundary formed by the lapped surface and the original one, it is easily seen that P actually diffused into the $GaAs_{1-x}P_x$ crystal through the surface during the Zn diffusion process in accordance with the invention and increased the content in P in the crystal in proximity to the surface, i.e., in accordance with the invention the diffusion of Zn and the production of the window effect are carried out by only one single process step.

The diode thus fabricated emitted red visible light of 6,500 A through an epoxy-lens-coating layer with an external quantum efficiency of 0.16 percent, while for a diode fabricated from an identical crystal by the conventional method an efficiency of 0.05 percent was obtained.

EXAMPLE 2

A diode having identical characteristics with those described in Example 1 can be obtained by using the diffusion source indicated in Table 2. This is probably due to the fact that the vapor composition from diffusion sources, whose composition lies, in the Ga-P-zn phase diagram, in a triangular region, the three apices of which are $Zn_3P_2$, GaP and the point 16 where the content in P is lowest in the region 12 having a higher content in P among the two liquid phase regions 12 and 13, is independent of the composition of the utilized diffusion sources and is determined only by the composition corresponding to the above-mentioned point 16.

While we have shown and described only one embodiment in accordance with the present invention, it is understood that the same is not limited thereto but is susceptible of numerous changes and modifications as known to those skilled in the art and we therefore do not wish to be limited to these details as shown and described herein, but intend to cover all such changes and modifications as are encompassed by the scope of the appended claims.

What we claim is:

1. A method of making high efficiency light emitting $GaAs_{1-x}P_x$ ($0<x<0.6$) diodes comprising the steps of placing an n-type GaAs $_{1-x}P_x$ ($0<x<0.6$) crystal and a diffusion source, whose composition lies, in the Ga-P-Zn phase diagram, in a triangular region, the three apices of which are substantially $Zn_3P_2$, GaP and the point where the content in phosphorus is lowest in the region having the higher content in phosphorus among two liquid phase regions, in a refractory ampoule; and heating said ampoule at a temperature between about 700° and about 800°C so as to diffuse zinc into said crystal and at the same time increasing the phosphorus content in proximity to the surface of said crystal.

2. A method of making high efficiency light emitting GaAs $_{1-x}P_x$ $(0<x<0.6)$ diodes by the diffusion method comprising the steps of placing an n-type $GaAs_{1-x}P_x$ $(0<x<0.6)$ crystal and a diffusion source in a refractory ampoule, said diffusion source having a composition lying in the triangular region in the Ga-P-Zn phase diagram, the three apices of which are $Zn_3P_2$, GaP, and the point where the content in the phosphorus is lowest in the region having the higher content in phosphorus among two liquid phase regions; heating said ampoule at a temperature between about 700°C and about 800°C so as to diffuse zinc into said crystal to form a p-n junction and at the same time diffusing phosphorus into said crystal through the surface thereby increasing the content of the phosphorus in the crystal in proximity to the surface.

3. The method of claim 2, wherein said heating is carried out for sufficient time to allow said zinc to diffuse into the crystal to a depth of about 3 to about 5 microns.

4. The method of claim 2, wherein said GaAs-$_{1-x}P_x(0<x<0.6)$ is a layer about 50 microns in thickness doped with selenium, tellurium, or sulphur, $x$ having the value equal to 0.4 on a substrate, wherein said heating is carried out for a sufficient time to produce a p-type layer having a thickness of from about 3 to 5 microns composed of $GaAs_{1-x}P_x(0.4<x<0.5)$ doped with zinc more strongly nearer the surface to which a positive electrode is to be attached thereby decreasing the electrical resistance of said surface and in which x increases gradually from 0.4 to 0.5 with increasing distance from the n-type $GaAs_{0.6}P_{0.4}$ layer.

5. The method of claim 4, wherein said substrate is composed of a $n^+$-type GaAs about 100 microns thick doped with selenium, tellurium, or sulphur.

6. The method of claim 2, wherein said diffusion source consists of a combination of 5.0 milligrams of Ga, 2.2 milligrams of P, 5.0 milligrams of GaP and 13.6 milligrams of Zn.

7. The method of claim 2, wherein said diffusion source consists of 3.6 milligrams of Ga, 1.6 milligrams of P, 6.0 milligrams of GaP, and 5.4 milligrams Zn.

* * * * *